United States Patent
Hinderer et al.

(10) Patent No.: US 10,175,315 B2
(45) Date of Patent: Jan. 8, 2019

(54) NMR APPARATUS COMPRISING A SUPERCONDUCTING MAGNET ASSEMBLY AND COOLED PROBE COMPONENTS

(71) Applicant: Bruker BioSpin AG, Faellanden (CH)

(72) Inventors: Joerg Hinderer, Waldshut-Tiengen (DE); Robert Schauwecker, Zurich (CH)

(73) Assignee: Bruker BioSpin AG, Faellanden (CH)

( * ) Notice: Subject to any disclaimer, the term of this patent is extended or adjusted under 35 U.S.C. 154(b) by 0 days.

(21) Appl. No.: 15/673,095

(22) Filed: Aug. 9, 2017

(65) Prior Publication Data
US 2018/0045797 A1 Feb. 15, 2018

(30) Foreign Application Priority Data

Aug. 9, 2016 (DE) .......................... 10 2016 214 731

(51) Int. Cl.
G01R 33/38 (2006.01)
G01R 33/3815 (2006.01)

(52) U.S. Cl.
CPC ..... *G01R 33/3804* (2013.01); *G01R 33/3815* (2013.01)

(58) Field of Classification Search
CPC ........................ G01R 33/3804; G01R 33/3815
USPC ............................................ 324/322; 62/51.1
See application file for complete search history.

(56) References Cited

U.S. PATENT DOCUMENTS

| 5,193,348 A | 3/1993 | Schnapper |
| 2005/0202976 A1 | 9/2005 | Killoran |
| 2006/0096301 A1 | 5/2006 | Triebe et al. |
| 2006/0097146 A1 | 5/2006 | Strobel |
| 2006/0130493 A1 | 6/2006 | Strobel |
| 2007/0107445 A1 | 5/2007 | Boesel et al. |

(Continued)

FOREIGN PATENT DOCUMENTS

| DE | 4039129 A1 | 6/1992 |
| DE | 102013213020 A1 | 1/2015 |

(Continued)

OTHER PUBLICATIONS

Office Action in corresponding German Application 102016214731, dated Feb. 27, 2017, along with English Translation.

(Continued)

*Primary Examiner* — Melissa Koval
*Assistant Examiner* — Courtney McDonnough
(74) *Attorney, Agent, or Firm* — Edell, Shapiro & Finnan, LLC

(57) ABSTRACT

A superconducting magnet assembly includes a cryostat, a vacuum vessel and a refrigeration stage. An NMR probe using the assembly includes comprises cooled probe components, a two-stage cryocooler, and a counter flow heat exchanger. A cooling circuit guides coolant from one outlet of the counter flow heat exchanger back to an inlet of the counter flow heat exchanger via the second cooling stage, a cooled probe component, and a heat exchanger in the cryostat or a heat exchanger in a helium suspension tube. Both the intake temperature of the coolant flowing into the heat exchanger in the cryostat or in the suspension tube and the return flow temperature of the emerging coolant are at least 5 K lower than the operating temperature of the first cooling stage. Excess cooling capacity of the cryocooler reduces the evaporation rate of liquid helium or cools a superconducting magnet in a cryogen-free cryostat.

14 Claims, 13 Drawing Sheets

(56) References Cited

U.S. PATENT DOCUMENTS

2012/0242335 A1    9/2012   Schett et al.
2012/0319690 A1   12/2012   Ma et al.
2015/0007586 A1    1/2015   Kraus et al.

FOREIGN PATENT DOCUMENTS

EP        1655616 A1    5/2006
JP     2006284213 A    10/2006
JP      200678070 A    10/2007
JP      201525659 A     8/2016

OTHER PUBLICATIONS

Office Action in corresponding Japanese Application 2017151851, dated Feb. 6, 2018, along with English Translation.
Office Action in corresponding Japanese Application 2017151851, dated May 22, 2018, along with English Translation.
Satoshi Ito, "4. NMR and Refrigeration/Cooling", Refrigeration, Japan Society of Refrigeration and Air Conditioning Engineers, Feb. 15, 2012, vol. 87, No. 1012, pp. 100-105.

NMR APPARATUS COMPRISING A SUPERCONDUCTING MAGNET ASSEMBLY AND COOLED PROBE COMPONENTS

CROSS REFERENCE TO RELATED APPLICATIONS

This application claims foreign priority under 35 U.S.C. § 119(a)-(d) to German Application No. 10 2016 214 731 filed on Aug. 9, 2016, the entire contents of which are hereby incorporated into the present application by reference.

FIELD OF INVENTION

The present invention relates to a cryogenic system for cooling a superconducting magnet coil system and for cooling components of an NMR probe, for example for use in nuclear magnetic resonance (NMR) spectroscopy or magnetic resonance imaging (MRI). The applicability of the invention is not restricted to this field, however.

BACKGROUND

Superconducting magnet coil systems are operated in a cryostat in order to keep the temperature below the transition temperature of the superconductor. Typically, the cryostat has a vacuum vessel with one or more cryogenic vessels each containing a coolant, for example liquid helium or liquid nitrogen. The superconducting magnet coil system is installed in the coldest cryogenic vessel. This results in the superconducting magnet coil system being cooled in a highly temperature-stable and uniform manner. Systems of this kind may be used to cool NMR spectrometers in a bath, for example. In these systems, the vessels have to be refilled with the coolants at regular intervals because the heat input to the cryogenic vessels ensures that the coolants evaporate continuously. Alternatively, the coolants can be condensed by a cryocooler, or cooling may be achieved by thermally attaching the superconducting magnet coil system and/or one or more radiation shields of the cryostat to a cooling stage of a cryocooler.

In order to install an NMR probe, the vacuum vessel of the cryostat is typically provided with a room temperature access port into the cold bore of the superconducting magnet coil system. Since operating the NMR probe at colder temperatures improves signal quality, NMR probes may include cooled components. Various designs of NMR cryogenic probes of this kind are known. Usually, NMR cryogenic probes are attached in the room temperature access port of the cryostat so as to be removable. In this case, the cooled components may be arranged in a separate insulation vessel and may be cooled by a cooling circuit. NMR cryogenic probes that are at least in part fixedly mounted to the insulation vacuum of the cryostat are, however, also known.

Various cryogenic systems for cooling a superconducting magnet coil system and for cooling components of an NMR probe are known. These systems differ in particular with respect to the mechanical integration of the magnet assembly and NMR probe in an instrument-based unit, and with respect to the common use of components of the cryogenic system for cooling the magnet coil system and the NMR probe.

Some U.S. patent publications (US 2012/0242335 A1, US 2007/0107445 A1, US 2005/0202976 A1, and US 2006/0130493 A1 disclose assemblies comprising an NMR cryogenic probe that is attached in the room temperature access port of the cryostat of the magnet assembly so as to be removable.

In US 2007/0107445 A1, US 2005/0202976 A1, and US 2006/0130493 A1, the NMR cryogenic probe and parts of the cryostat of the magnet assembly are cooled by a common cryocooler.

In US 2007/0107445 A1 and US 2005/0202976 A1, helium gas from the cryostat of a superconducting magnet assembly is condensed at the helium gas outlet of the cryostat by a cryocooler. The cryocooler also cools the cooling circuit of an NMR cryogenic probe through heat exchangers. In US 2006/0130493 A1, a cryocooler is attached to the cryostat of a superconducting magnet assembly in a neck tube. The neck tube communicates with the helium vessel of the cryostat. Helium gas from the neck tube is guided through a cooling circuit into an NMR cryogenic probe. Helium gas is condensed at the bottom (coldest) end of the neck tube and flows back into the helium vessel of the cryostat.

These three assemblies are disadvantageous in that there is a high cost for cooling because the coldest stage of the cryocooler must be operated below the boiling point of liquid helium (4.2 K). Additionally, cryocooler vibrations are transferred to the cryostat because the cryocooler is attached directly to the helium gas outlet of the cryostat. Vibrations can affect NMR measurements.

In US 2012/0242335 A1, the NMR cryogenic probe is cooled by a cooling circuit that is thermally connected to a refrigeration reservoir of the cryostat of the magnet assembly, for example, to a nitrogen vessel. This assembly increases the cryogenic liquid consumption of the cryostat.

An assembly according to US 2012/0319690 A1 comprises an NMR cryogenic probe that is installed in the vacuum vessel of the cryostat of the superconducting magnet assembly. The magnet assembly and NMR cryogenic probe in this assembly are no longer mechanically modular. In order to replace the NMR cryogenic probe (for example, when there is a fault or in order to carry out NMR measurements that place different requirements on the functional scope of the NMR cryogenic probe), the cryostat vacuum has to be broken. Changing the NMR probe therefore requires that the superconducting magnet coil system be discharged and the magnet assembly be warmed.

The assembly according to EP 1 655 616 A1 or US 2006/0096301 A1 discloses an NMR apparatus having the following features:
- superconducting magnet assembly
- cryostat comprising a vacuum vessel
- superconducting magnet coil system comprising a cold bore in which a room temperature access port of the cryostat engages
- NMR cryogenic probe in the room temperature access or in the cold bore
- NMR cryogenic probe comprising probe components cooled to an operating temperature of <100 K
- at least two-stage cryocooler having the coldest cooling stage at an operating temperature of <30 K
- cryocooler arranged in a separate, evacuated and heat-insulated housing so as to be spatially separated from the cryostat
- cooling circuit comprising thermally insulated cooling lines between the heat-insulated housing and the NMR cryogenic probe.

A two-stage cryocooler is located in a heat-insulated housing and cools the cooling circuit of an NMR cryogenic probe through heat exchangers and provides excess cooling capacity on the first (warmer) cooling stage. The excess cooling capacity condenses nitrogen gas from the nitrogen vessel of a cryostat, or cools a radiation shield of a cryostat of a superconducting magnet assembly. This assembly is disadvantageous in that the cooling capacity of the cryocooler cannot be used to reduce the evaporation rate of lower-boiling cryogenic fluids, such as liquid helium, because the temperature of the first cooling stage of the cryocooler is too high (approximately 35 K).

SUMMARY

An NMR apparatus may comprise a superconducting magnet assembly with a cryostat which has a vacuum vessel and a refrigeration stage that can be operated at an operating temperature of <100 K. The superconducting magnet assembly may also comprise a superconducting magnet coil system that includes a cold bore in which a room temperature access port (e.g., a warm bore) of the cryostat engages. The NMR apparatus may also include an NMR probe comprising probe components cooled to an operating temperature of <100 K during operation, an at least two-stage cryocooler having a second cooling stage at an operating temperature of <35.4 K and a first cooling stage having an operating temperature that is greater than the operating temperature of the second cooling stage. The cryocooler is arranged in a heat-insulated housing. A counter flow heat exchanger comprising two inlets and two outlets for two opposing coolant flows is provided in the heat-insulated housing. A cooling line guides coolant from a heat exchanger on the first cooling stage of the cryocooler, directly or indirectly, into the warm inlet of the counter flow heat exchanger. Another cooling line guides coolant from the cold outlet of the counter flow heat exchanger, directly or indirectly, to a heat exchanger on the second cooling stage of the cryocooler. A third cooling line guides coolant to a cooled probe component or to a heat exchanger on the cooled probe component, and another cooling line guides coolant to a heat exchanger in the cryostat.

The present invention improves an NMR apparatus comprising a superconducting magnet coil system in a cryostat and comprising an NMR cryogenic probe, such that excess cooling capacity of a cryocooler which cools the cooling circuit of an NMR cryogenic probe can be used to reduce the evaporation rate of liquid helium from a cryostat of a superconducting magnet assembly or to cool a superconducting magnet coil system in a cryogen-free cryostat.

The techniques presented herein use a heat exchanger that is arranged in the cryostat vacuum or in a suspension tube of the helium vessel of the cryostat of a superconducting magnet assembly. The heat exchanger is connected to the cooling circuit of an NMR cryogenic probe in which the coolant conveys heat to the second cooling stage of the cryocooler and which is separated by a counter flow heat exchanger from the portion in which the coolant conveys heat to the first cooling stage of the cryocooler. In particular, a the cooling circuit of an NMR cryogenic probe guides coolant from the cold outlet of the counter flow heat exchanger to the cold inlet of the counter flow heat exchanger via at least one heat exchanger on the second cooling stage of the cryocooler, a cooled probe component or a heat exchanger on the cooled probe component, and a heat exchanger in the cryostat or to a heat exchanger in a suspension tube of a helium vessel of the cryostat. In the operating state of the NMR apparatus, both the intake temperature of the coolant of the cooling circuit flowing into the heat exchanger in the cryostat or into the heat exchanger in the suspension tube of the helium vessel of the cryostat and the return flow temperature of the coolant emerging from this heat exchanger are at least 5 K lower than the operating temperature of the first cooling stage of the cryocooler.

The NMR apparatus presented herein provides a cooling circuit of an NMR cryogenic probe that can absorb thermal output from the cryostat of a superconducting magnet assembly and guide it to the second cooling stage of a cryocooler. In this way, in a cryostat comprising a helium vessel for receiving and cooling a superconducting magnet coil system, the helium evaporation rate from the helium vessel can be significantly reduced by, for example, using the cooling circuit to cool a radiation shield arranged around the helium vessel to temperatures of, typically, 10 K-30 K. Omitting complete suppression of the helium evaporation removes any requirement for the cooling capacity to be provided at a temperature below the boiling point of helium. It is thus possible to use a more favorable cryocooler and no direct mechanical contact between the cryocooler and the cryostat is required. In contrast, the cooler has to be arranged on the cryostat for assemblies that condense helium. As a result, the transmission of vibrations to the superconducting magnet assembly can be reduced.

As an alternative to cooling a radiation shield, it is also possible to cool a magnet coil assembly located directly in an insulation vacuum of a cryogen-free cryostat, provided that the superconducting transition temperature of the superconductor used is above a temperature of 10 K. This is the case, for example, in superconducting magnet coil systems comprising high-temperature superconductors (HTS) or magnesium diboride (MgB2).

In addition, a further refrigeration stage of the cryostat can be cooled by the cooling circuit, in which the return flow temperature of the coolant is above the operating temperature of the first stage of the cryocooler.

In some examples, the cooling circuit comprises heat-insulated cooling lines outside the heat-insulated housing, and the vacuum vessel of the cryostat is sealed in a vacuum-tight manner from an insulation vacuum of the heat-insulated cooling lines of the cooling circuit. This prevents the insulation vacuum of the cryostat from being broken if a vacuum is broken in the cooling circuit.

In other examples, cooled probe components are arranged in a separate heat-insulated vessel inside the room temperature access port of the cryostat. Heat-insulated cooling lines may be guided between the heat-insulated housing of the cryocooler and the cooled probe components, or between a heat exchanger on the cooled probe components and a heat exchanger in the cryostat vacuum. Arranging probe components to be cooled and cryostat components in insulation vacuums that are separate from one another makes the NMR apparatus more modular in nature, and therefore it is possible, for example, to change the NMR probe without breaking the insulation vacuum of the cryostat.

In these examples, the cooling circuit guides coolant from the second cooling stage of the cryocooler first to a heat exchanger in the cryostat vacuum, and then to a cooled probe component or to a heat exchanger on a cooled probe component.

Alternatively, the coolant of the cooling circuit may be guided from the second cooling stage of the cryocooler first to a cooled probe component or to a heat exchanger on a cooled probe component, and then to a heat exchanger in the cryostat vacuum. These two alternatives enable the lowest temperature provided by the cooling circuit either to optimally cool the cooled probe components or to optimally cool a refrigeration stage of the cryostat.

In further examples, the cooling circuit guides coolant from the second cooling stage of the cryocooler, in parallel, both to a cooled probe component or a heat exchanger on a cooled probe component, and to a heat exchanger in the cryostat vacuum. These examples ensure that the lowest temperature provided by the cooling circuit can be used in the same way, both for cooling the cooled probe components and for cooling a refrigeration stage of the cryostat.

In still more examples, cooled probe components are arranged, at least in part, in a region between the cold bore of the superconducting magnet coil system and the room temperature access port of the cryostat into the cold bore. The cooled probe components are arranged radially inside the cold bore but outside the room temperature access port of the cryostat and thermally connected to a heat exchanger in the cryostat vacuum that is connected to the cooling circuit. Installing the cooled probe components in the insulation vacuum of the cryostat of the superconducting magnet coil assembly saves space in the region between the cold bore of the superconducting magnet coil system and the sample chamber inside the NMR probe. Moreover, the assembly and the cooling circuit are thus simplified, which also results in a reduction of losses in cooling capacity in the cooling circuit. An NMR apparatus may be permanently operated using the same NMR probe.

In some examples, a heat exchanger in the cryostat vacuum that is connected to the cooling circuit is thermally connected both to cooled NMR probe components and to a refrigeration stage of the cryostat. This permits optimal cooling both of the cooled probe components and of the refrigeration stage of the cryostat.

In other examples, at least two heat exchangers connected to the cooling circuit are provided in the cryostat vacuum. The return flow temperature of the coolant of the cooling circuit coming from a heat exchanger in the cryostat vacuum that is connected to the cooling circuit being higher than the operating temperature of the first stage of the cryocooler. In these assemblies it is possible to use not only the cooling capacity of the second cooling stage of the cryocooler, but also that of the first (warmer) cooling stage thereof to cool a refrigeration stage of the cryostat. In particular, for example, nitrogen gas from a nitrogen vessel of the cryostat can be condensed, or a radiation shield can be cooled to temperatures between 35 K and 80 K.

In a further example, a heat exchanger connected to the cooling circuit is arranged in the cryostat vacuum or in a suspension tube of a helium vessel of the cryostat, and is thermally connected to a refrigeration stage of the cryostat that comprises a radiation shield or a cryogen vessel. These examples may include magnet assemblies comprising a superconducting magnet coil system of low-temperature superconductors, in which the cryostat typically comprises a helium vessel for receiving the superconducting magnet coil system. The helium vessel may be surrounded by a radiation shield which is in turn surrounded by a nitrogen vessel (helium-nitrogen bath cryostat). In an assembly of this kind, a heat exchanger can be arranged in the cryostat vacuum and brought into thermal contact with the radiation shield. If the heat exchanger is connected to the cooling circuit in the portion of the cooling circuit of an NMR cryogenic probe in which the coolant conveys heat to the second cooling stage of the cryocooler, the radiation shield can typically be cooled to temperatures of 10 K-30 K. As a result, the helium evaporation rate can be significantly reduced in comparison with a cryostat that does not have this connection to the cooling circuit.

In a helium-nitrogen bath cryostat, in order to use the helium gas flow to cool the radiation shield, the radiation shield may be thermally connected to a suspension tube of the helium vessel. The suspension tube also acts as an outlet for vaporized helium gas. A heat exchanger connected to the cooling circuit of the cryogenic probe can be attached in the suspension tube of the helium vessel at this point, and the heat exchanger can cool the radiation shield. The advantage of this arrangement of the heat exchanger compared with an arrangement thereof in the cryostat vacuum is that, for example, an existing helium-nitrogen bath cryostat can be retrofitted therewith. In a further variant of these examples, a heat exchanger in the cryostat vacuum that is connected to the cooling circuit of the cryogenic probe may be attached to the nitrogen vessel so that said vessel is cooled to a temperature of below 77 K, which prevents the evaporation of nitrogen from the nitrogen vessel.

In further examples, the superconducting magnet coil system is directly arranged in the insulation vacuum of the cryostat, and a heat exchanger in the cryostat vacuum, which is connected to the cooling circuit, is thermally connected to the superconducting magnet coil system. The superconducting magnet coil system comprises the superconducting materials $MgB_2$ or HTS (BSCCO, ReBCO). In these assemblies, the temperature of less than 30 K that can be achieved at the heat exchanger in the cryostat vacuum is particularly advantageous for the superconducting magnet assembly because the superconducting materials mentioned can already be superconducting at these temperatures, and therefore it is possible to omit more complex cooling using a liquid helium bath.

In additional examples, cooled probe components are arranged in a separate heat-insulated vessel inside the room temperature access port of the cryostat. The cryostat comprises a helium vessel for receiving a superconducting magnet coil system, and a first radiation shield with a nitrogen vessel or a second radiation shield. The cooling circuit is guided through the vacuum vessel of the cryostat to at least two heat exchangers in the cryostat vacuum. A first heat exchanger connected to the cooling circuit is thermally connected to the first radiation shield, and the return flow temperature of the coolant coming from the first heat exchanger is lower than the operating temperature of the first stage of the cryocooler. A second heat exchanger connected to the cooling circuit is thermally connected to the nitrogen vessel or the second radiation shield, and the return flow temperature of the coolant coming from the second heat exchanger is higher than the operating temperature of the first stage of the cryocooler. These examples advantageously build upon a commercially available NMR cryogenic probe and the cooling circuit thereof. Moreover, the examples use a conventional design of the cryostat of a superconducting magnet assembly, in particular for cooling superconducting magnet coil systems of low-temperature superconductors. A particular advantage is that excess cooling capacity from both cooling stages of the cryocooler of the cooling circuit of the NMR cryogenic probe is used to cool the cryostat.

In still further examples, cooled probe components are arranged in a separate heat-insulated vessel inside the room temperature access port of the cryostat. The cryostat comprises a helium vessel for receiving a superconducting magnet coil system, and a radiation shield with a nitrogen vessel. The cooling circuit is guided through the vacuum vessel of the cryostat to a first heat exchanger in the cryostat vacuum that is thermally to the radiation shield. The return flow temperature of the coolant coming from the first heat exchanger is lower than the operating temperature of the first stage of the cryocooler. A second heat exchanger that is connected to the cooling circuit is located in the nitrogen vessel or in a vessel that communicates with the nitrogen vessel. The return flow temperature of the coolant coming from the second heat exchanger is higher than the operating temperature of the first stage of the cryocooler. These examples advantageously build upon a commercially available NMR cryogenic probe and the cooling circuit thereof. Moreover, these examples use a conventional design of the cryostat of a superconducting magnet assembly, in particular for cooling superconducting magnet coil systems of low-temperature superconductors. A particular advantage is that excess cooling capacity from both cooling stages of the cryocooler of the cooling circuit of the NMR cryogenic probe is used to cool the cryostat. Attaching a second heat exchanger, connected to the cooling circuit, in the nitrogen vessel of the cryostat or in a vessel that communicates with the nitrogen vessel is an advantageous simplification, in terms of apparatus, compared with attaching the second heat exchanger in the cryostat vacuum. Furthermore, this assembly is particularly suitable for retrofitting existing cryostats.

In another example, cooled probe components may include a high frequency (HF) resonator and/or a pre-amplifier. The cooling has a particularly advantageous effect on the signal quality in these two components of an NMR probe.

DETAILED DESCRIPTION

Figure 1:
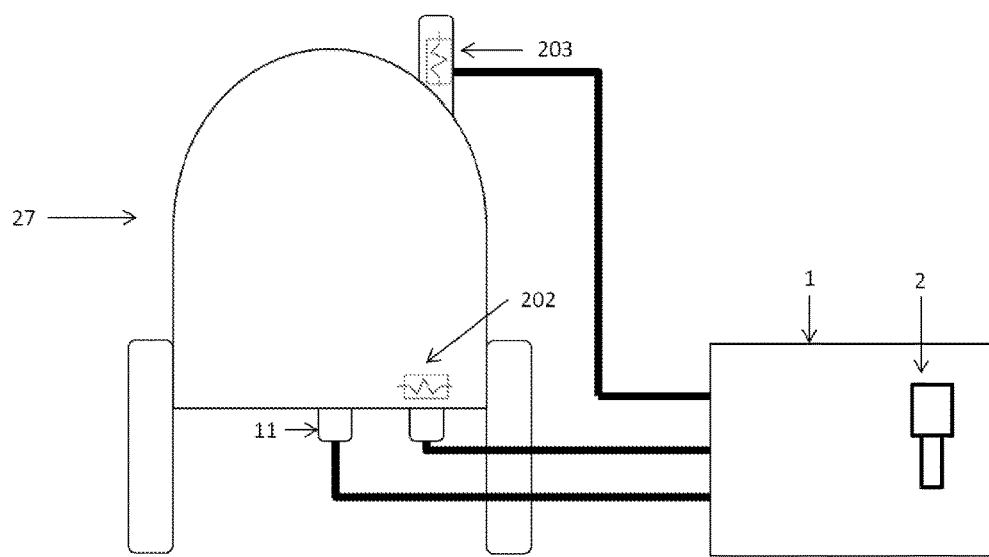
FIG. 1 is a schematic view of an NMR apparatus comprising a superconducting magnet assembly, an NMR probe, a heat-insulated housing for receiving a cryocooler, and three cooling coupling interfaces that are indicated by way of example by a heat exchanger in the cryostat vacuum, a heat exchanger in a vessel that communicates with a nitrogen vessel, and the connection to the NMR probe.
Figure 2:
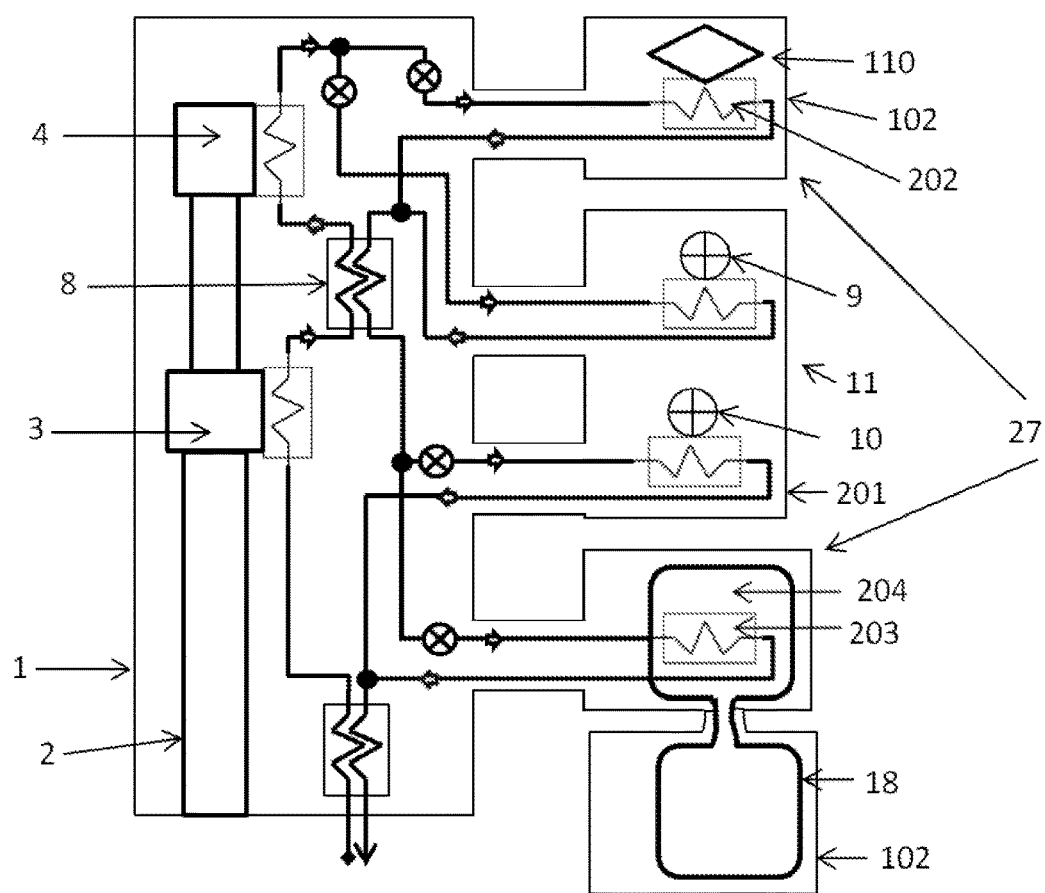
FIG. 2 is a schematic view of an example embodiment of a cooling circuit of an NMR apparatus in which the coolant flow is distributed over two temperature levels, with a radiation shield of a superconducting magnet assembly and a first cooled probe component being cooled at the lower temperature level, and a second cooled probe component and nitrogen in a vessel that communicates with the nitrogen vessel of a superconducting magnet assembly being cooled/condensed at the higher temperature level.

The invention is explained in greater detail in the following with reference to examples. FIG. 2 schematically shows the topology of the coolant flow in an example embodiment. In the subsequent FIGS. 3 to 8, this basic design is varied for other uses.

The structure comprises four functional units, specifically the cryocooler 2, the components to be cooled, the compressor, and coolant lines including heat exchangers. The cryocooler 2 comprises a first cooling stage 3 and second cooling stage 4 that can be seen on the left-hand side of FIGS. 2-8. In FIG. 2, the four components to be cooled (i.e., radiation shield 110, probe component 9, probe component 10, and vessel 204) are shown by way of example on the right-hand side. Two of the components (e.g., radiation shield 110 and cooled probe component 9) are approximately at the temperature of the first cooling stage. The other two components (e.g., cooled probe component 10 and vessel 204) are approximately at the temperature of the second cooling stage 4. The cooling is provided by circulating a coolant that thermally couples the respective cooling stages 3, 4 to the components 110, 9, 10, 204 to be cooled, which are spatially separated therefrom. This thermal coupling may be achieved by heat exchangers through which coolant flows, or by directly contacting the components with the coolant. The coolant fluid is conveyed through a room-temperature compressor (not shown), which can, for example, also be the compressor of the cryocooler 2 and from which a small partial flow is diverted. The two counter flow heat exchangers enable the individual components to be operated at three different temperature levels, specifically the compressor at room temperature, the first cooling stage 3 and the warmer two of the components 10, 204 to be cooled at an intermediate temperature, and the second cooling stage 4 and the colder two of the components 110, 9 to be cooled at the lowest temperature.

Starting from the compressor, the coolant first passes through a counter flow heat exchanger that brings the coolant to a temperature that is above but within the order of magnitude of the operating temperature of the first cooling stage 3. At this stage, the coolant is cooled to the temperature of the first cooling stage before reaching, via the counter flow heat exchanger 8, a temperature that is above but within the order of magnitude of the operating temperature of the second cooling stage 4. After flowing through the counter flow heat exchanger 8, the coolant is then cooled to the temperature of the second cooling stage 4. The coolant has thus reached the coldest point of the cooling circuit and subsequently passes through the branch of the cooling circuit in which the coolant absorbs heat at the components to be cooled and at the counter flow heat exchangers. Finally, the coolant has again reached room temperature and is guided back into the low-pressure side of the compressor. The branch(es) of the cooling circuit may differ in different examples, according to which of the components are cooled or how the coolant is topologically guided. Additionally, two components that are at the same temperature stage can be connected in series or in parallel.

In the variant shown in FIG. 2, a first radiation shield 110 is cooled to the lower of the two temperature levels and a heat exchanger 203 is cooled in order to condense nitrogen in a vessel 204 that communicates with the nitrogen vessel 18, in addition to cooling the cooled probe components 9, 10. Cooling the first radiation shield 110 with the coolant flow, to the colder of the two temperature levels makes it possible to lower the temperature of the radiation shield 110 in comparison with conventional cryostat assemblies. This reduces the helium evaporation rate of the superconducting magnet assembly 27 and thus prolongs filling intervals for liquid helium.

In terms of vacuum technology, the overall structure can be divided into three volumes that are each evacuated: the heat-insulated housing 1, the vacuum vessel 102 of the cryostat, and the heat-insulated vessel 201 of the NMR probe 11. In the figures, these three volumes are shown throughout, in a simplified manner, as communicating with each other. However, the three volumes can also be formed with structural elements, such as valves, feedthroughs, and/or fluid couplings, which make it possible to functionally separate the volumes in terms of vacuum technology. Similarly, the insulation vacuums of the connecting lines between the heat-insulated housing 1 and the vacuum vessel 102 of the cryostat and/or the heat-insulated vessel 201 of the NMR probe 11 can also be formed as volumes that can be separated in terms of vacuum technology, for example, using valves, feedthroughs, or fluid couplings.

Figure 10:
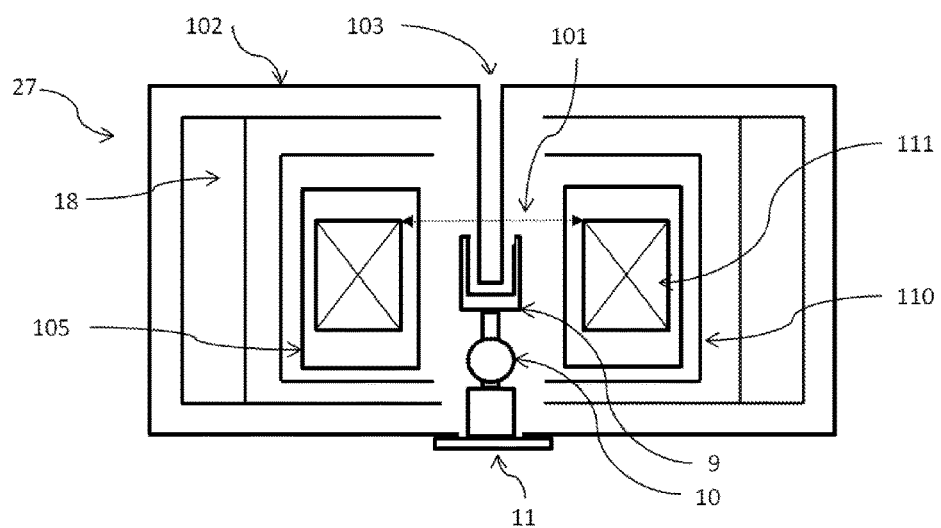
FIG. 10 is a schematic view of an example embodiment of a superconducting magnet assembly and an NMR probe of an NMR apparatus, in which the cooled probe components of the NMR probe are arranged in the cryostat vacuum, and the probe seals the vacuum vessel of the cryostat in a vacuum-tight manner, and in which the room temperature access port of the cryostat is formed axially only as far as the position of a cooled probe component of an NMR probe.

In FIG. 2, the first radiation shield 110 and the cooled probe component 9 are each coupled to respective heat exchangers. These two heat exchangers are at approximately the same temperature level. In the case of an integrated design of the superconducting magnet assembly 27 and the NMR probe 11, as shown in FIG. 10 for example, the first radiation shield 110 and the cooled probe component 9 can also be jointly coupled to a single heat exchanger 102. The second heat exchanger is then omitted.

Figure 3:
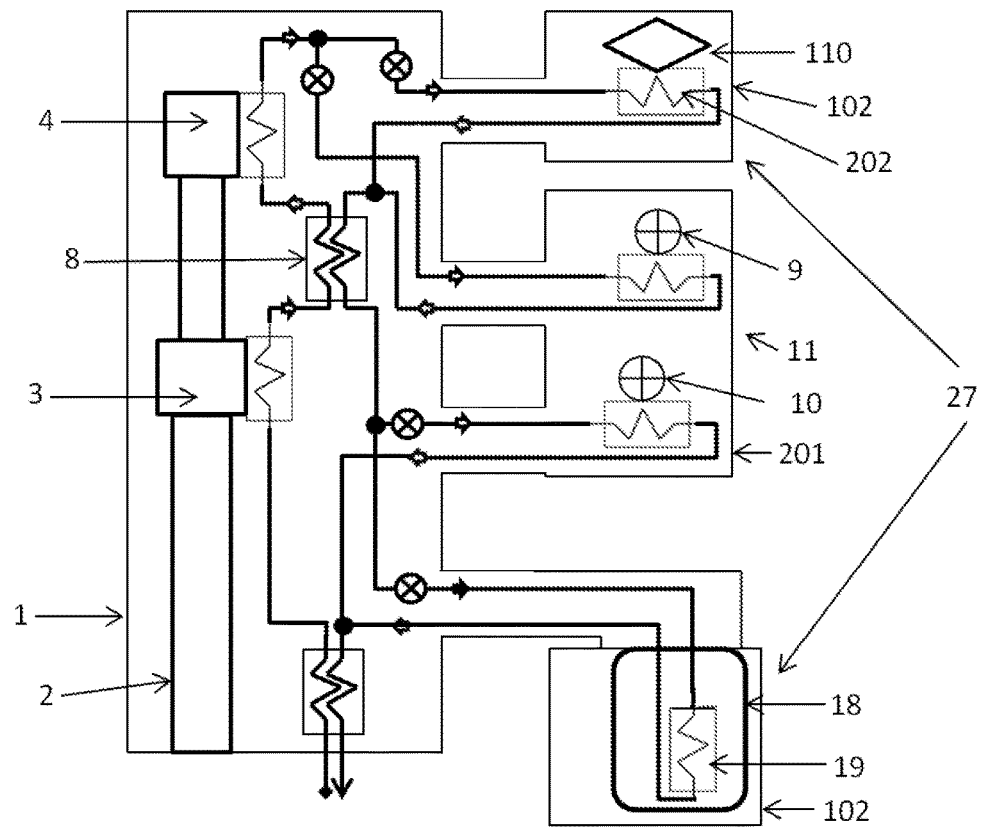
FIG. 3 is a schematic view of an example embodiment of a cooling circuit of an NMR apparatus, in which the coolant flow is distributed over two temperature levels, with a radiation shield of a superconducting magnet assembly and a first cooled probe component being cooled at the lower temperature level, and a second cooled probe component and nitrogen in a nitrogen vessel of a superconducting magnet assembly being cooled/condensed at the higher temperature level, with a heat exchanger being located in the nitrogen vessel.

FIG. 3 is a modification of FIG. 2, with nitrogen being condensed directly in the nitrogen vessel 18, instead of the nitrogen condensation occurring in a separate vessel 204 that communicates with the nitrogen vessel 18.

Figure 4:
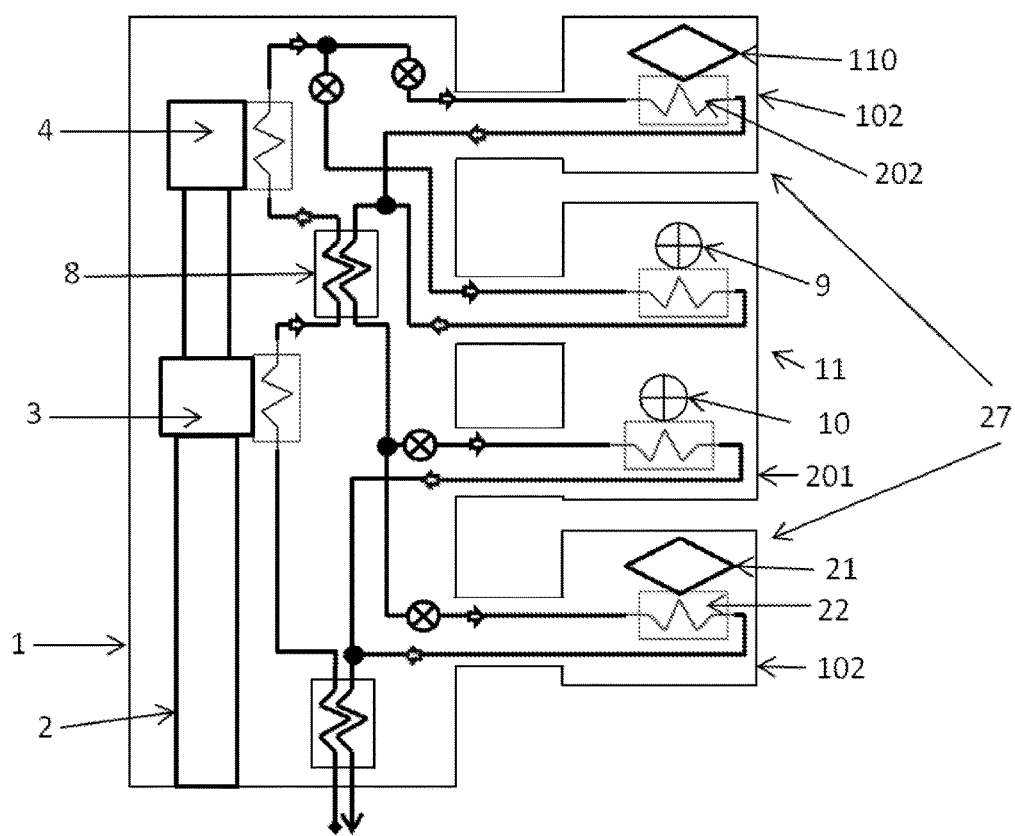
FIG. 4 is a schematic view of an example embodiment of a cooling circuit of an NMR apparatus, in which the coolant flow is distributed over two temperature levels, with a radiation shield of a superconducting magnet assembly and a first cooled probe component being cooled at the lower temperature level, and a second cooled probe component and a second radiation shield of a superconducting magnet assembly being cooled at the higher temperature level.
Figure 5:
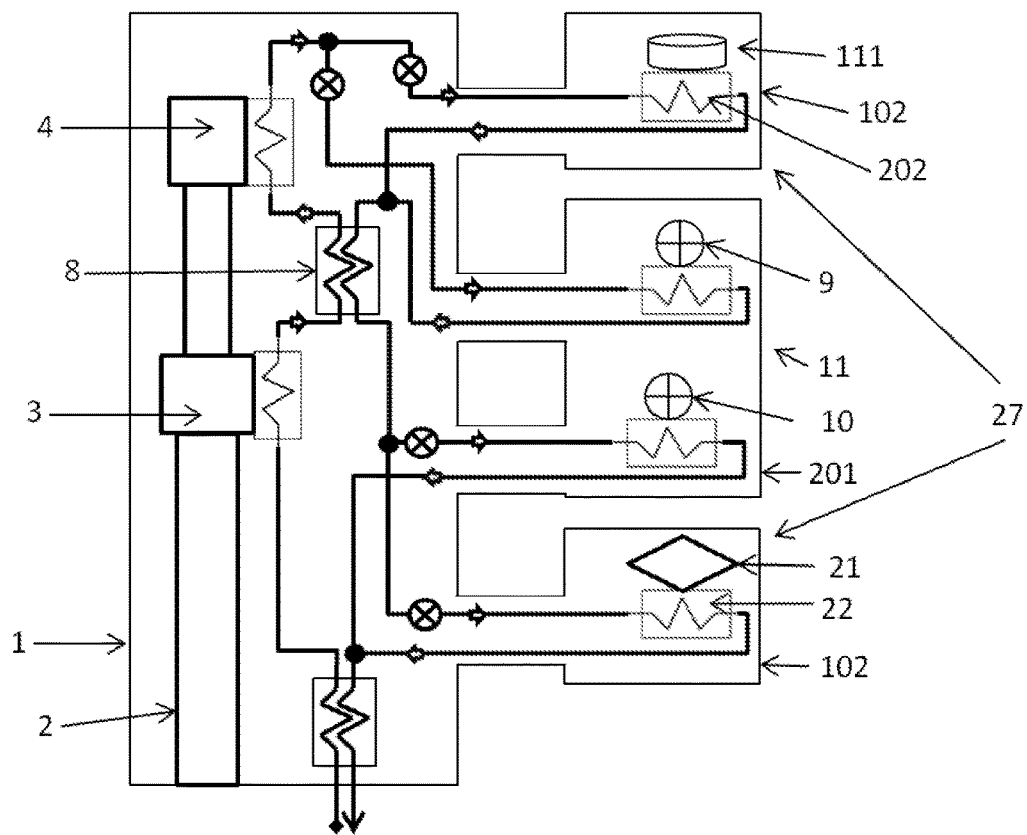
FIG. 5 is a schematic view of an example embodiment of a cooling circuit of an NMR apparatus, in which the coolant flow is distributed over two temperature levels, with a superconducting magnet coil system of a superconducting magnet assembly and a first cooled probe component being cooled at the lower temperature level, and a second cooled probe component and a second radiation shield of a superconducting magnet assembly being cooled at the higher temperature level.

FIG. 4 is a modification of FIG. 2, with a second radiation shield 21 being arranged in place of the nitrogen vessel 18 of the superconducting magnet assembly 27. FIG. 5 is a modification of FIG. 2, with a superconducting magnet coil system 111 being used in place of the radiation shield 110. The operating temperature of the superconducting magnet coil system 111 is above the operating temperature of the second stage 4 of the cryocooler 2. In this case, the helium bath and the helium vessel 105 can be completely omitted and the magnet is cooled directly by the coolant, e.g. cooled with a heat exchanger 202. Similar to the cooling of the superconducting magnet system 111, the second radiation shield 21 is cooled by the coolant flow, as in FIG. 4. This variant is advantageous in particular for uses involving high-temperature superconductors or $MgB_2$ superconductors.

Figure 6:
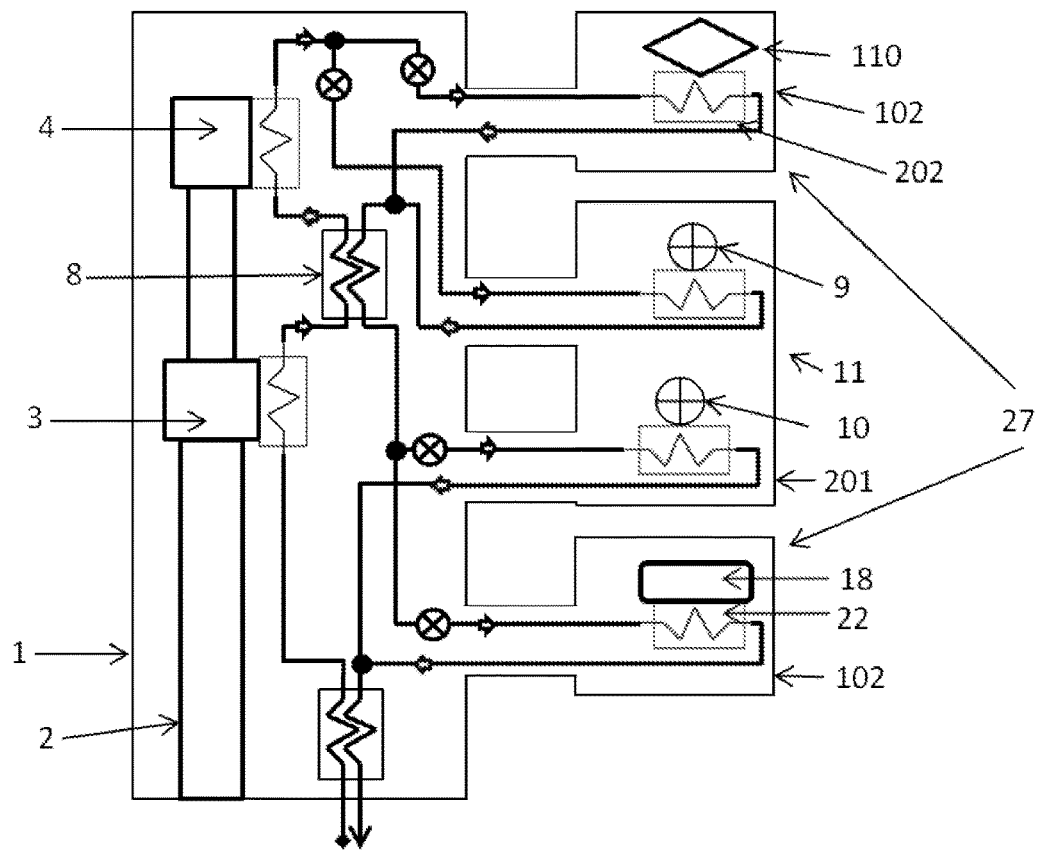
FIG. 6 is a schematic view of an example embodiment of a cooling circuit of an NMR apparatus, in which the coolant flow is distributed over two temperature levels, with a radiation shield of a superconducting magnet assembly and a first cooled probe component being cooled at the lower temperature level, and a second cooled probe component and a heat exchanger being cooled at the higher temperature level, with the heat exchanger being in thermal contact with the nitrogen vessel such that nitrogen is condensed in the vessel.

FIG. 6 is a modification of FIG. 3, with the heat exchanger 22 for providing the cooling capacity for nitrogen condensation being accommodated not in the nitrogen vessel 18 but rather in the adjacent vacuum region. The cooling capacity for condensing the nitrogen results from heat conduction through the wall that defines the vacuum space.

Figure 7:
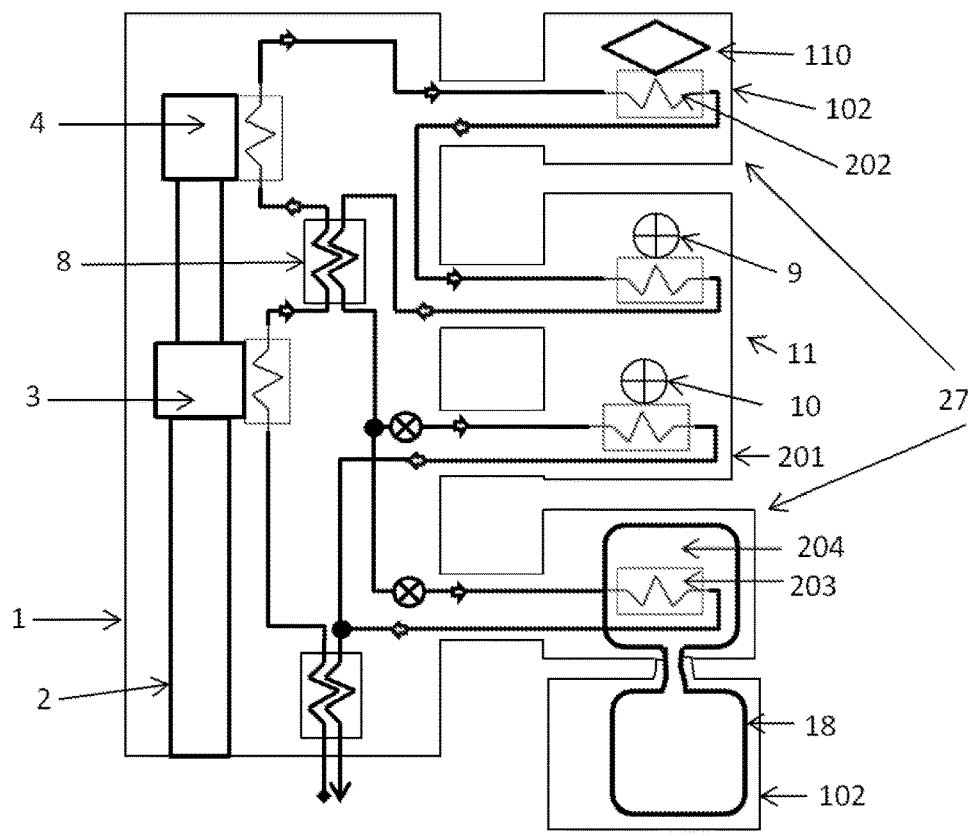
FIG. 7 is a schematic view of an example embodiment of a cooling circuit of an NMR apparatus, in which the coolant flow flows in succession (i.e., in series) through the components at the lower temperature level, with coolant flowing first to a radiation shield of a superconducting magnet assembly and then to a first cooled probe component 9 being cooled at the lower temperature level, and with a second cooled probe component and nitrogen in a vessel that communicates with the nitrogen vessel of a superconducting magnet assembly being cooled/condensed at the higher temperature level.

FIG. 7 is a modification of FIG. 2, with the coolant at the lower operating temperature flowing to the cooled probe component 9 and the heat exchanger 202 in series, instead of in parallel. This arrangement makes it possible to achieve a temperature gradation of the components to be cooled in this part of the cooling circuit, such as the cooled probe component 9 and the radiation shield 110. This arrangement may be advantageous if, for example, one arm inputs much less heat than the other, and the performance of the system benefits more from a stable and low temperature.

Figure 8:
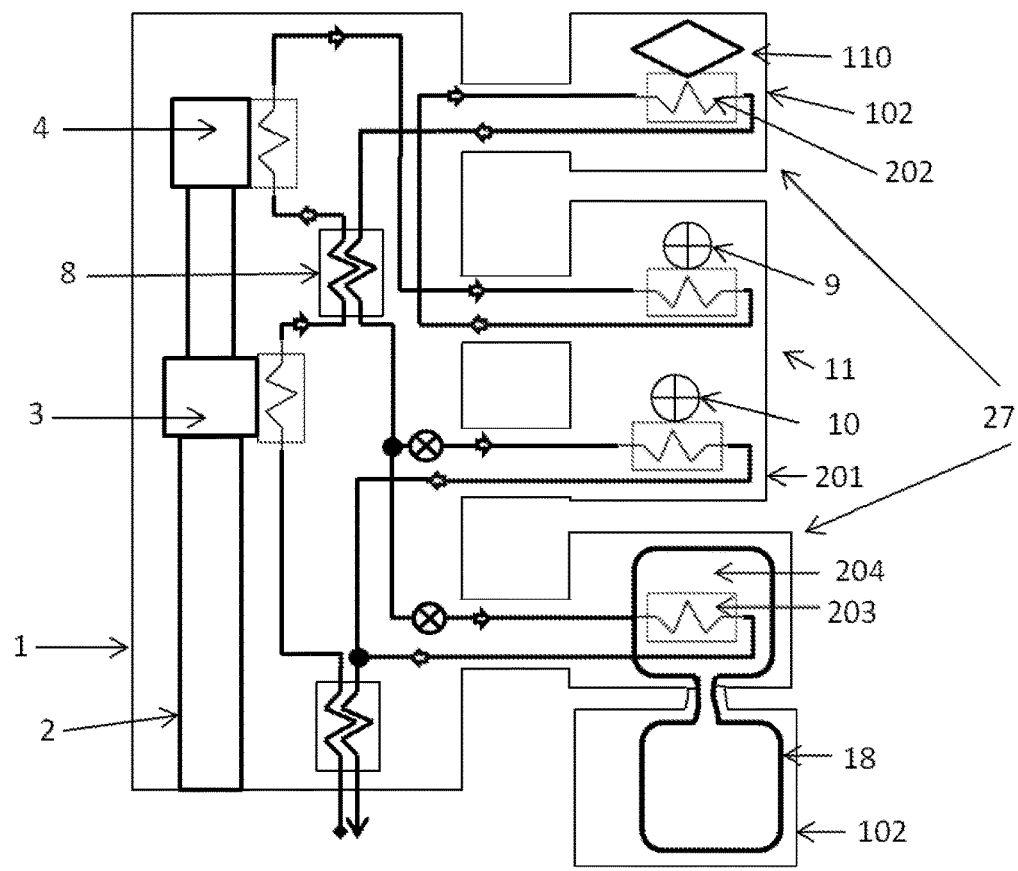
FIG. 8 is a schematic view of an example embodiment of a cooling circuit of an NMR apparatus, in which the coolant flow flows in succession (in series) through the components at the lower temperature level, with coolant flowing first to a first cooled probe component and then to a radiation shield of a superconducting magnet assembly being cooled at the lower temperature level, and with a second cooled probe component and nitrogen in a vessel that communicates with the nitrogen vessel of a superconducting magnet assembly being cooled/condensed at the higher temperature level.
Figure 9:
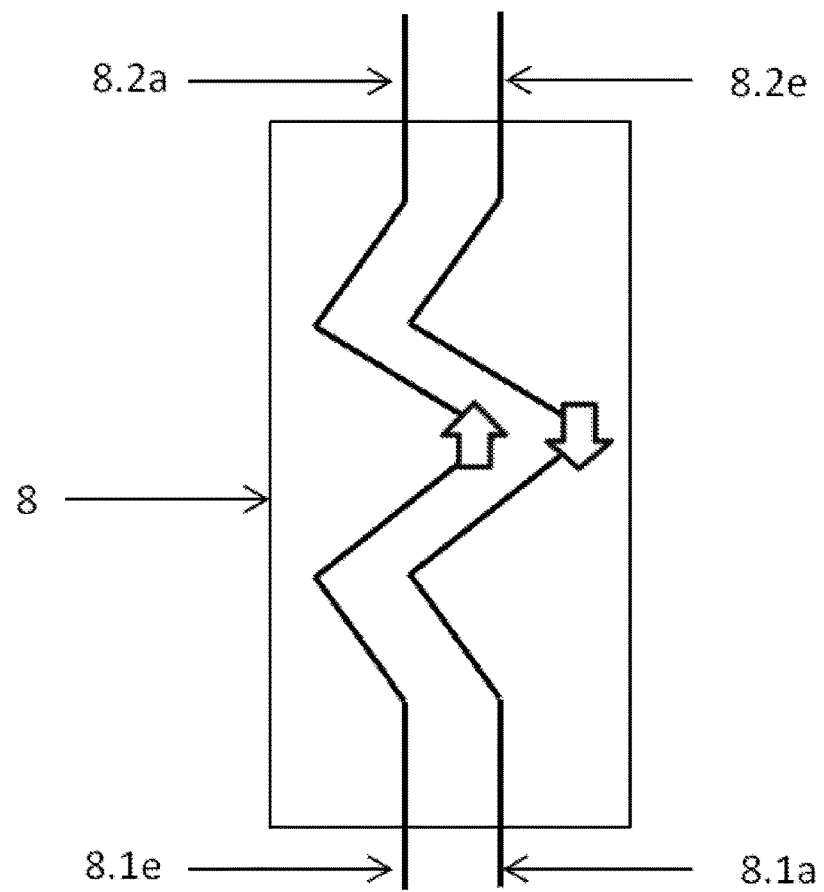
FIG. 9 shows a counter flow heat exchanger comprising a cold side inlet, a cold side outlet, a warm side inlet, and a warm side outlet.

FIG. 8 is a modification of FIG. 7, with the coolant flowing in the reverse order through the serially connected components to be cooled.

FIG. 10 is a schematic view of an example of a superconducting magnet assembly 27 and an NMR probe 11 of an NMR apparatus, in which the cooled probe components 9, 10 of the NMR probe 11 are arranged in the cryostat vacuum and the NMR probe 11 closes the vacuum vessel 102 of the cryostat in a vacuum-tight manner. The room temperature bore 103 of the cryostat is formed axially only as far as the position of a cooled probe component 9 of the NMR probe 11. In this case, the superconducting magnet coil system 111 is positioned in a helium vessel 105 where it is kept at its operating temperature, typically when the helium is liquid.

The helium vessel 105 is surrounded by a first radiation shield 110 which keeps most of the radiant heat that is incident from the nitrogen vessel 18 away from the helium vessel 105, reducing the helium consumption. The lower the temperature of this first radiation shield 110, the lower the evaporation rate of the helium from the helium vessel 105. The first radiation shield 110 is surrounded by a nitrogen vessel 18 which in turn keeps most of the incident heat from the room temperature vacuum vessel 102 of the cryostat away from the first radiation shield 110.

All the intermediate spaces between the helium vessel 105, the first radiation shield 110, the nitrogen vessel 18, and vacuum vessel 102 of the cryostat may be evacuated to prevent heat conduction and convection. The superconducting magnet coil system 111 comprises a cold bore 101 in which a room temperature access port 103 engages. The access port 103 is used for positioning the sample to be measured in the center of the superconducting magnet assembly 27. A cooled probe component 9 is positioned between this central magnetic field region and the superconducting magnet coil system 111. The cooled probe component 9 is used to irradiate the sample with radio frequency radiation and to detect the signal returning from the sample. A further cooled probe component 10 is positioned below the cooled probe component 9 and is used to process the extremely weak radio frequency signal coming from the sample before the signal is relayed to other parts of the NMR spectrometer. These two components are parts of the NMR probe 11 which, in this case, also seals the insulation vacuum of the superconducting magnet assembly 27.

Figure 11:
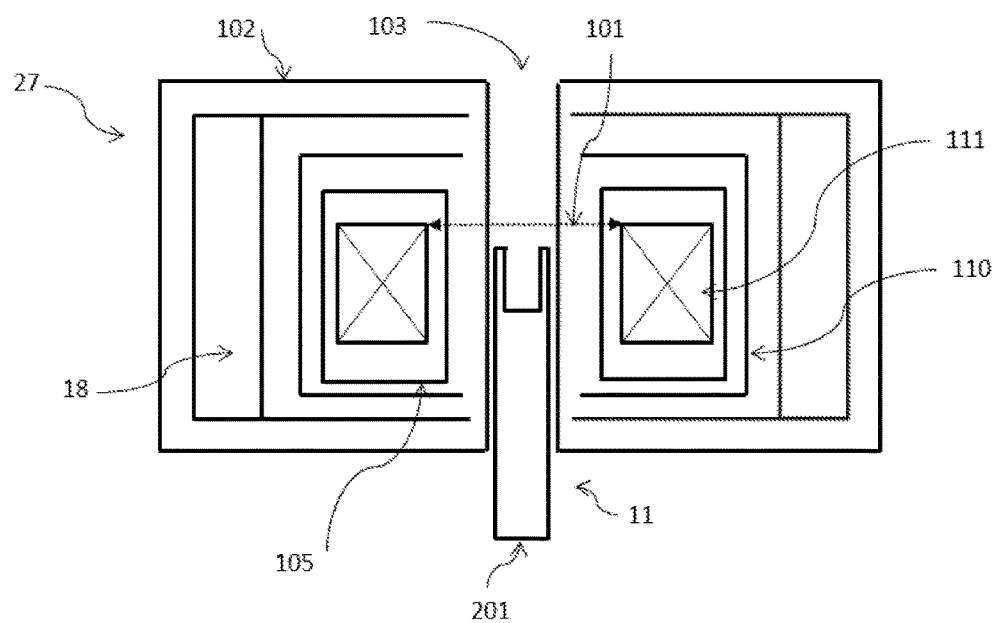
FIG. 11 is a schematic view of an example embodiment of a superconducting magnet assembly and an NMR probe of an NMR apparatus, in which the room temperature access port is continuous, and in which a thermally insulated vessel of the NMR probe is arranged inside the room temperature access port and the superconducting magnet assembly comprises a nitrogen vessel.

FIG. 11 is a schematic view of an example embodiment of a superconducting magnet assembly 27 and an NMR probe 11 of an NMR apparatus, in which the NMR probe 11 comprising the cooled probe components 9, 10 is structurally separate from the superconducting magnet assembly 27. In this example, the structure of the superconducting magnet assembly 27 is designed having a continuous room temperature access port 103. The NMR probe 11 comprises a heat-insulated vessel 201 having an insulation vacuum for receiving the cooled probe components 9, 10. The superconducting magnet assembly 27 and the NMR probe 11 are thus completely independent of one another in terms of vacuum technology.

Figure 12:
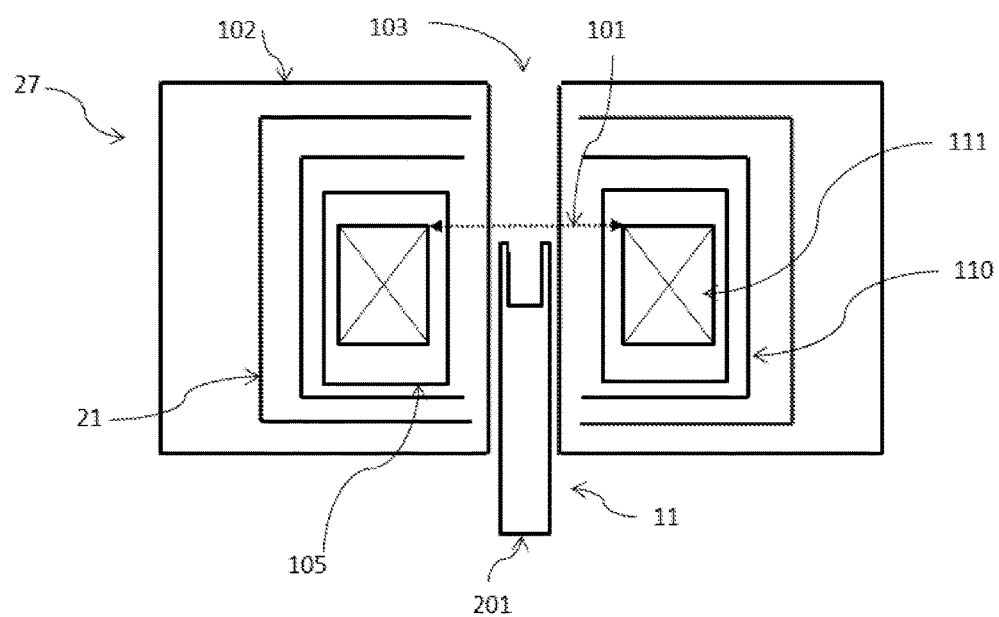
FIG. 12 is a schematic view of an example embodiment of a superconducting magnet assembly and an NMR probe of an NMR apparatus, in which the room temperature access port is continuous, and in which the heat-insulated vessel of the NMR probe is arranged inside the room temperature access port and the superconducting magnet assembly comprises a second radiation shield.

FIG. 12 is a modification of FIG. 11, with a second radiation shield 21 being arranged in place of the nitrogen vessel 18 of the superconducting magnet assembly 27.

Figure 13:
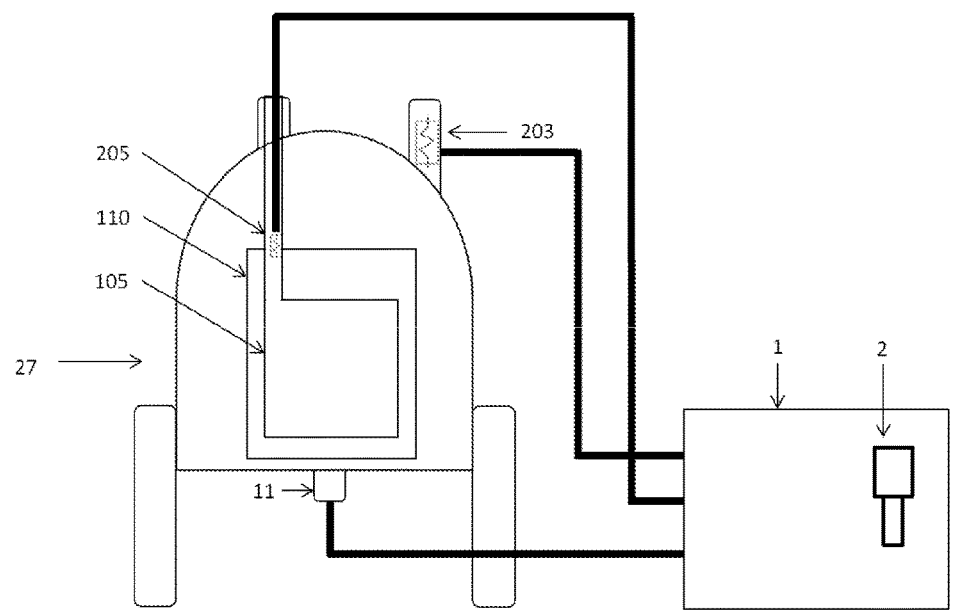
FIG. 13 is a schematic view of an example embodiment of a superconducting magnet assembly, an NMR probe, and a cooling circuit of an NMR apparatus, in which the coolant flow is guided to the superconducting magnet assembly at two temperature levels, with a radiation shield of the superconducting magnet assembly being cooled at the lower temperature level, vaporized nitrogen from the superconducting magnet assembly being condensed at the higher temperature level, and the radiation shield being cooled by a heat exchanger positioned in a suspension tube of the helium vessel of the superconducting magnet assembly.

FIG. 13 is a modification of FIG. 2, in which the cooling circuit is guided through a suspension tube of the helium vessel 105 of the superconducting magnet assembly 27 to a heat exchanger 205 in the suspension tube of the helium vessel. The heat exchanger 205 is positioned in close thermal contact with the first radiation shield 110, such that the cooling capacity can be efficiently coupled. This example enables a retrofitted installation in existing superconducting magnet assemblies 27 since no structural changes need to be made to the assemblies.

LIST OF REFERENCE SIGNS 1 heat-insulated housing
2 cryocooler
3 first cooling stage of the cryocooler
4 second cooling stage of the cryocooler
8 counter flow heat exchanger
8.1a warm outlet of the counter flow heat exchanger
8.1e warm inlet of the counter flow heat exchanger
8.2a cold outlet of the counter flow heat exchanger
8.2e cold inlet of the counter flow heat exchanger
9 cooled probe component
10 cooled probe component
11 NMR probe
18 nitrogen vessel
19 heat exchanger in the nitrogen vessel
21 second radiation shield
22 heat exchanger in the cryostat
27 superconducting magnet assembly
101 cold bore of the superconducting magnet coil system
102 vacuum vessel of the cryostat
103 room temperature access port
105 helium vessel
110 first radiation shield
111 superconducting magnet coil system
201 heat-insulated vessel
202 heat exchanger in the cryostat
203 heat exchanger in the vessel that communicates with the nitrogen vessel
204 vessel that communicates with the nitrogen vessel
205 heat exchanger in a suspension tube of the helium vessel

What is claimed is:

1. An apparatus comprising:
    a superconducting magnet assembly comprising:
        a cryostat with a vacuum vessel and a refrigeration stage operable at a temperature of <100 K; and
        a superconducting magnet coil system with a cold bore and a room temperature access port of the cryostat;
    a nuclear magnetic resonance (NMR) probe including probe components cooled to a temperature of <100 K;
    a cryocooler arranged in a heat-insulating housing, and having a second cooling stage at a second operating temperature of <35.4 K and a first cooling stage at a first operating temperature that is greater than the second operating temperature of the second cooling stage;
    a counter flow heat exchanger provided in the heat-insulating housing, the counter flow heat exchanger comprising a warm inlet and a cold outlet for a first coolant flow and a cold inlet and a warm outlet for a second coolant flow, wherein the first coolant flow is in a direction opposing the second coolant flow;
a first cooling line guiding coolant from a first heat exchanger on the first cooling stage of the cryocooler, directly or indirectly, into the warm inlet of the counter flow heat exchanger;
a second cooling line guiding coolant from the cold outlet of the counter flow heat exchanger, directly or indirectly, to a second heat exchanger on the second cooling stage of the cryocooler;
a third cooling line guiding coolant to a first cooled probe component or to a third heat exchanger on the first cooled probe component; and
a fourth cooling line guiding coolant to a fourth heat exchanger in the cryostat, wherein a cooling circuit guides coolant from the cold outlet of the counter flow heat exchanger to the cold inlet of the counter flow heat exchanger via the second heat exchanger on the second cooling stage of the cryocooler, a second cooled probe component or a fifth heat exchanger on the second cooled probe component, and a sixth heat exchanger in the cryostat vacuum or a seventh heat exchanger in a suspension tube of a helium vessel of the cryostat, such that both an intake temperature of the coolant of the cooling circuit flowing into the sixth heat exchanger in the cryostat vacuum or into the seventh heat exchanger in the suspension tube of the helium vessel of the cryostat and a return flow temperature of the coolant emerging from the sixth heat exchanger or the seventh heat exchanger are at least 5 K lower than the first operating temperature of the first cooling stage of the cryocooler.

2. The apparatus according to claim 1, wherein the cooling circuit comprises heat-insulated cooling lines outside the heat-insulated housing, and wherein the vacuum vessel of the cryostat is sealed in a vacuum-tight manner from an insulation vacuum of the heat-insulated cooling lines of the cooling circuit.

3. The apparatus according to claim 1, wherein the second cooled probe component is arranged in a separate heat-insulated vessel of the NMR probe inside the room temperature access port of the cryostat, and wherein heat-insulated cooling lines are guided between the heat-insulated housing of the cryocooler and the second cooled probe component, or between the fifth heat exchanger on the second cooled probe component and the sixth heat exchanger in the cryostat.

4. The apparatus according to claim 3, wherein the cooling circuit guides coolant from the second cooling stage of the cryocooler in series, first to the sixth heat exchanger in the cryostat, and then to the second cooled probe component or to the fifth heat exchanger on the second cooled probe component.

5. The apparatus according to claim 3, wherein the cooling circuit guides coolant from the second cooling stage of the cryocooler in series, first to the second cooled probe component or to the fifth heat exchanger on the second cooled probe component, and then to the sixth heat exchanger in the cryostat.

6. The apparatus according to claim 3, wherein the cooling circuit guides coolant from the second cooling stage of the cryocooler, in parallel, both to the second cooled probe component or the fifth heat exchanger on the second cooled probe component, and to the sixth heat exchanger in the cryostat.

7. The apparatus according to claim 1, wherein the cooled probe component is arranged, at least in part, in a region between the cold bore of the superconducting magnet coil system and the room temperature access port of the cryostat, radially inside the cold bore but outside the room temperature access port of the cryostat and thermally connected to the sixth heat exchanger in the cryostat that is connected to the cooling circuit.

8. The apparatus according to claim 7, wherein the sixth heat exchanger in the cryostat that is connected to the cooling circuit is thermally connected both to the second cooled probe component and to the refrigeration stage of the cryostat.

9. The apparatus according to claim 1, further comprising an eighth heat exchanger connected to the cooling circuit that is provided in the cryostat, the coolant of the cooling circuit coming from the eighth heat exchanger having a higher temperature than the first operating temperature of the first cooling stage of the cryocooler.

10. The apparatus according to claim 1, wherein one of the heat exchangers connected to the cooling circuit is arranged in the cryostat or in the suspension tube of the helium vessel of the cryostat, and is thermally connected to the refrigeration stage of the cryostat that comprises a radiation shield or a cryogen vessel.

11. The apparatus according to claim 1, wherein the superconducting magnet coil system is directly arranged in an insulation vacuum of the cryostat, and wherein the sixth heat exchanger is thermally connected to the superconducting magnet coil system, and wherein the superconducting magnet coil system comprises MgB2 or High Temperature Superconductors (HTS).

12. The apparatus according to claim 1, wherein the second cooled probe component is arranged in a separate heat-insulated vessel inside the room temperature access port of the cryostat, and wherein the cryostat comprises a helium vessel for receiving the superconducting magnet coil system, and a first radiation shield and a nitrogen vessel or a second radiation shield, and wherein the cooling circuit is guided through the vacuum vessel of the cryostat to the sixth heat exchanger that is thermally connected to the first radiation shield and the fourth heat exchanger that is thermally connected to the nitrogen vessel or to the second radiation shield, and wherein the coolant coming from the sixth heat exchanger is at a lower temperature than the first operating temperature of the first cooling stage of the cryocooler, and wherein the coolant coming from the fourth heat exchanger is at a higher temperature than the first operating temperature of the first cooling stage of the cryocooler.

13. The apparatus according to claim 1, wherein the second cooled probe component is arranged in a separate heat-insulated vessel inside the room temperature access port of the cryostat, and wherein the cryostat comprises a helium vessel for receiving the superconducting magnet coil system, a radiation shield, and a nitrogen vessel, and wherein the cooling circuit is guided through the vacuum vessel of the cryostat to the sixth heat exchanger in the cryostat that is thermally connected to the radiation shield, the coolant coming from the sixth heat exchanger being at a lower temperature than the first operating temperature of the first cooling stage of the cryocooler, and wherein the fourth heat exchanger that is connected to the cooling circuit is located in the nitrogen vessel or in a vessel that communicates with the nitrogen vessel, the coolant coming from the fourth heat exchanger being at a higher temperature than the first operating temperature of the first cooling stage of the cryocooler.

14. The apparatus according to claim 1, wherein the first cooled probe component or the second cooled probe component comprises a high frequency (HF) resonator or a pre-amplifier.

* * * * *